United States Patent
Dennard et al.

(10) Patent No.: US 6,426,905 B1
(45) Date of Patent: Jul. 30, 2002

(54) HIGH SPEED DRAM LOCAL BIT LINE SENSE AMPLIFIER

(75) Inventors: Robert H. Dennard, New Rochelle, NY (US); Ronald W. Knepper, Andover, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/777,004

(22) Filed: Feb. 7, 2001

(51) Int. Cl.[7] ............................... G11C 7/00
(52) U.S. Cl. ................. 365/204; 365/203; 365/208; 365/210
(58) Field of Search ................. 365/203, 204, 365/205, 206, 207, 208, 189.09, 185.21, 210, 222

(56) References Cited

U.S. PATENT DOCUMENTS

| | | | | |
|---|---|---|---|---|
| 4,477,886 A | * | 10/1984 | Au | |
| 4,608,670 A | * | 8/1986 | Duvvury et al. | |
| 4,669,063 A | * | 5/1987 | Kirsch | |
| 4,982,363 A | * | 1/1991 | Sood | 365/189.01 |
| 5,027,008 A | * | 6/1991 | Runaldue | 326/30 |
| RE34,026 E | * | 8/1992 | Duvvury et al. | |
| 5,237,533 A | * | 8/1993 | Papaliolios | 365/207 |
| 5,315,555 A | * | 5/1994 | Choi | |
| 5,325,338 A | * | 6/1994 | Runaldue et al. | 365/230.05 |
| 5,339,274 A | * | 8/1994 | Dhong et al. | |
| 5,963,484 A | * | 10/1999 | Jung | 365/189.09 |
| 6,000,843 A | * | 12/1999 | Sawada | 371/21.4 |

* cited by examiner

Primary Examiner—David Nelms
Assistant Examiner—Gene N. Auduong
(74) Attorney, Agent, or Firm—Scully, Scott, Murphy & Presser; Robert M. Trepp, Esq.

(57) ABSTRACT

Disclosed is a high speed sense amplifier circuit designed for sensing data in one-transistor DRAM memory cells on bit lines within DRAM macros. The circuit utilizes a charge transfer scheme to rapidly remove charge from a small sensing first capacitor C1, generating a voltage swing delta V1, via an FET operating in its subthreshold region by means of idling current, such transfer supplying an equal charge to the larger bit line capacitance Cb1 with small voltage swing delta Vb1. The sense amp is pre-charged to the "1" state, and senses a "0" via the charge transfer operation thusly described. A "1" is sensed when no charge transfer takes place.

15 Claims, 4 Drawing Sheets

HIGH SPEED DRAM LOCAL BIT LINE SENSE AMPLIFIER

BACKGROUND OF THE INVENTION

This invention generally relates to DRAMs; and more specifically, to sense amplifiers (or sense "amps") used in DRAMS.

Today'S DRAM technology tends to provide a high density of electronic memory, but with relatively slow random (row) access time. This is primarily due to the industry's efforts at growing the density of DRAM chips by 4× every generation (every 3 years). Bit lines are made very long and heavily loaded. Bit line sensing has been done with standard latch-type sense amps using a folded differential bit line approach and several on-chip generated clocks for latching the data in the sense amp. Typical row access times have been about 30–40 ns at chip level, which has been adequate for most main memory applications.

With today's interest in merging DRAM and logic technology on the same chip, there is an interest in building DRAM macros of about 1 Mbits or 2 Mbits each and merging these within the logic of the particular chip, depending upon the application.

SUMMARY OF THE INVENTION

An object of this invention is to provide very high speed DRAM macros that have the cell density of DRAM single transistor cells with the access time and cycle time speeds more typical of SRAM technology.

Another object of the present invention is to provide for very high speed local bit line sensing which can be used to set a macro output latch/driver for a very high bandwidth and low latency memory.

A further object of this invention is to provide a 1 M bit DRAM macro that can be accessed (random access) in about 5 ns nominal delay using CMOS technology with embedded DRAM.

These and other objectives are attained with a sense amplifier for detecting a change of charge out of an input node, and comprising a first current source and a first field effect transistor. The current source is provided for removing charge from the input node. The field effect transistor includes (i) a source coupled to the input node, (ii) a gate electrode coupled to a first voltage, and (iii) a drain coupled to one side of a first capacitor, to an output node, and to a precharge circuit for setting the voltage of the output node to a second voltage, providing a voltage difference between the drain and source of said first transistor. The other side of the capacitor is coupled to ground.

With a preferred embodiment, the precharge circuit includes a control signal coupled to a gate of a second field effect transistor for turning off the precharge circuit prior to sensing, and the sense amplifier further includes a second current source coupled to the output node for supplying charge to the output node. Also, the charge removed by the first current source is preferably substantially equal to the charge added by the second current source. The first current source is preferably set to bias the first field effect transistor to conduct at a current corresponding to the current at weak inversion (near the threshold voltage) of the first field effect transistor.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
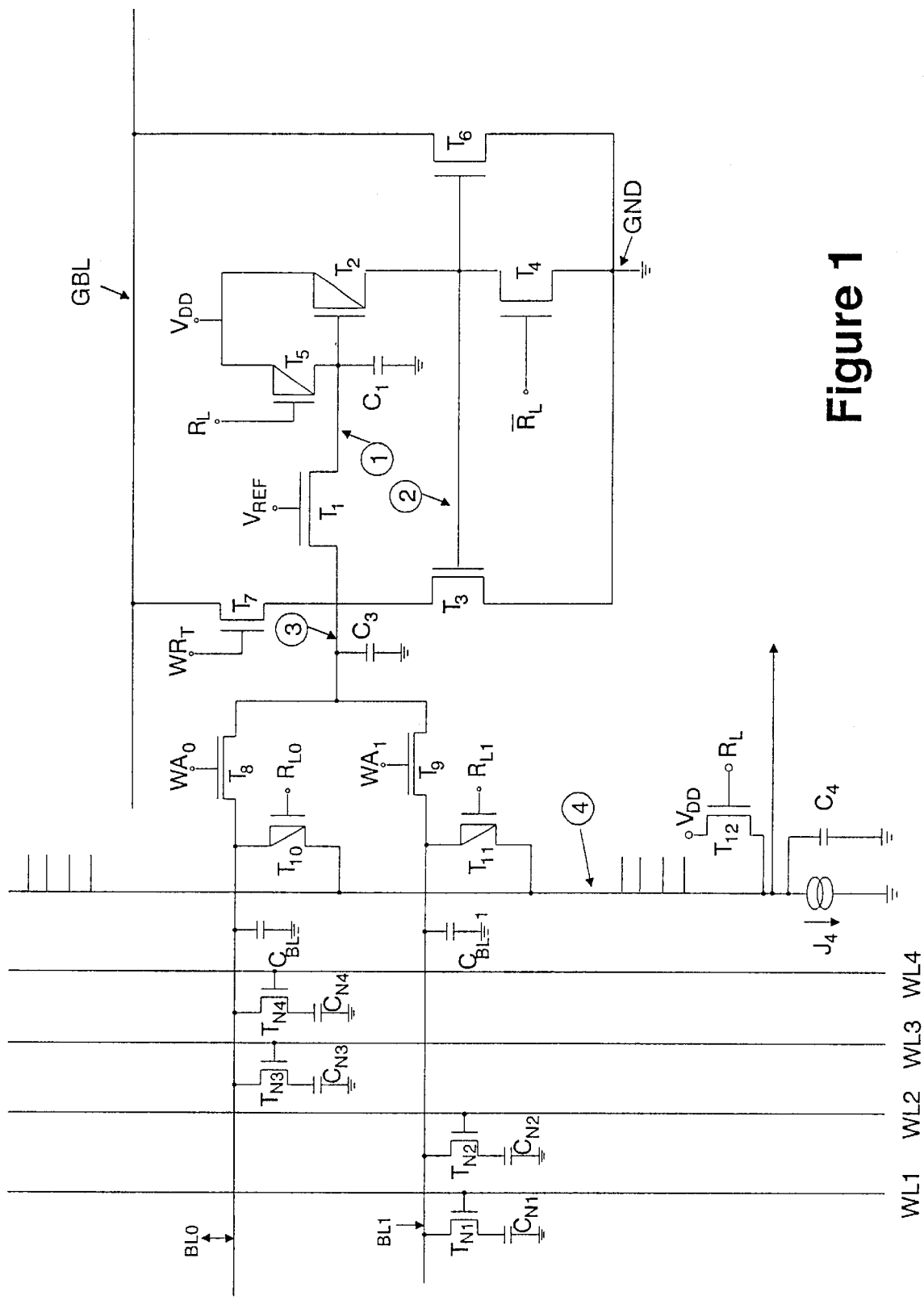
FIG. 1 is a schematic drawing of a sense amp circuit embodying this invention.

Referring to the drawings, FIG. 1 shows a preferred embodiment of the invention. This embodiment is a part of an entire DRAM macro which can be designed into a logic or ASIC chip with an embedded DRAM CMOS process technology. The invention has particular application to implementation of System-On-A-Chip or System Scale Integration approaches where it is desired to integrate large amounts of high bandwidth, low latency memory with high speed logic circuitry.

The Local Bit Line Sense Amplifier given in FIG. 1 is comprised of CMOS transistors T1 through T11, both N-channel and P-channel FET's. The P-channel CMOS FET's are shown with a diagonal line across the substrate portion of the device schematic drawing. Attached to the Local Bit Line Sense Amplifier are two local bit lines BL0 and BL1 with a number of corresponding 1-transistor DRAM cells shown attached to the local bit lines. Shown in FIG. 1 are four cells, given by CMOS transistors TN1 through TN4 and DRAM cell capacitors CN1 through CN4. The four cells are accessed by word lines WL1 through WL4 which are respectively attached to the gates of DRAM cell transistors TN1 through TN4. It is understood from the FIG. 1 circuit schematic that local bit lines BL0 and BL1 may extend further in the left-ward direction with additional cells attached having cell transistors, cell capacitors, and word lines similarly to that indicated in the Figure.

The Local Bit Line Sense Amplifier also attaches to global bit line GBL shown in FIG. 1, which in turn receives the sense data output and provides the write data input to the sense amplifier. Such GBL attaches to a global sense amplifier (not shown on the Figure), and also provide access for numerous other Local Bit Line Sense Amplifiers identical to the one shown on FIG. 1, which attach to line GBL. The exact number of cells attaching to each local bit line and the exact number of local bit line sense amps attaching to each global bit line are design parameters which can be selected based on the size and construction of the DRAM memory macro being built up by the circuitry of FIG. 1.

Also shown on FIG. 1 are the idle current line (node 4), CMOS transistor T12, idle current source J4, and idle line capacitance C4. Idle current line 4 also attaches to other local bit line sense amplifier circuits, implied both above and below the existing local bit line sense amplifier circuit shown on FIG. 1, extending for the entire height of the DRAM macro under consideration. Only one such transistor T12, current source J4, and capacitor C4 exist for the idle line 4 shown. Other local bit line pairs, with their corresponding local bit line sense amps to the right or left of the one shown in FIG. 1, each contain a similar idle current line, all of which attach to current source J4 and large capacitor C4 at node 4, as indicated in FIG. 1.

Figure 2:
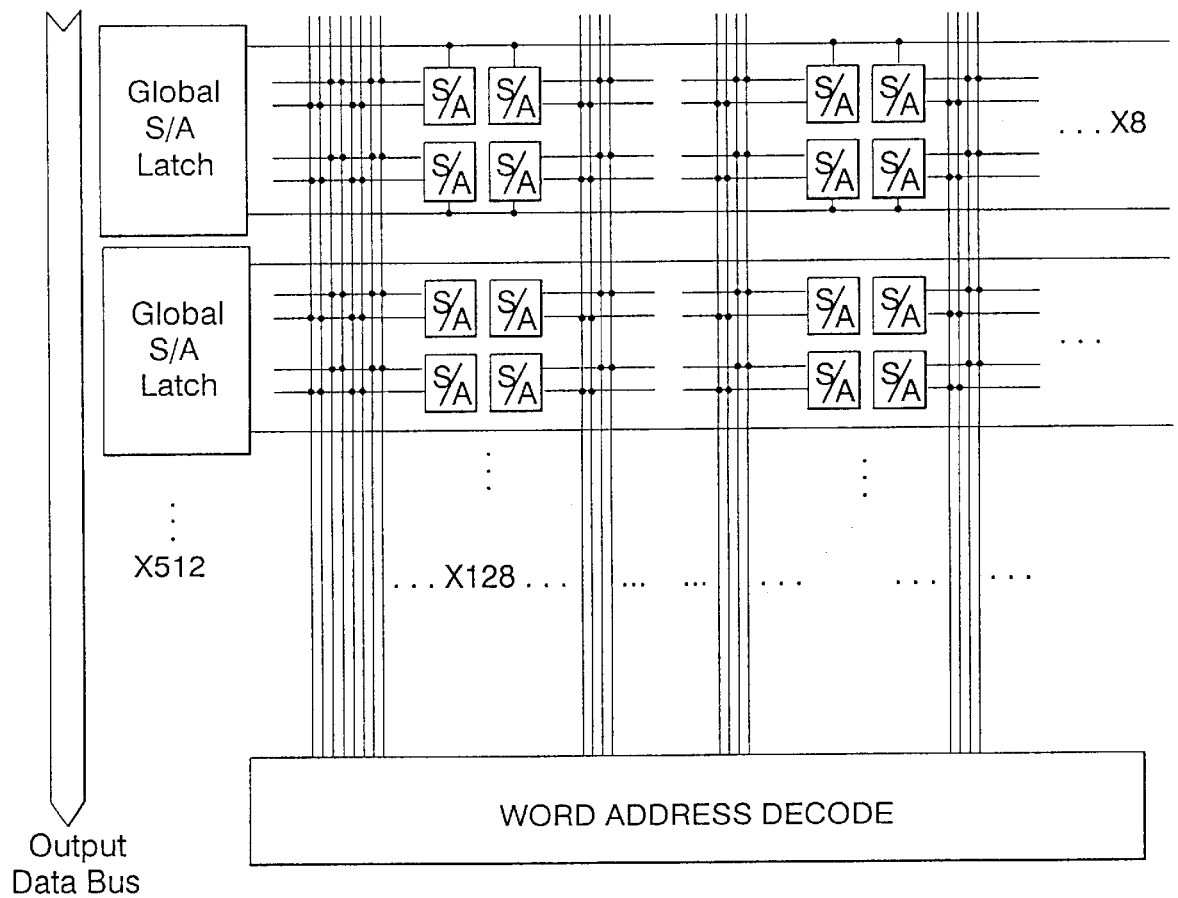
FIG. 2 schematically shows a layout and construction of a DRAM utilizing the amplifier circuit of FIG. 1.

A typical layout and construction of such a DRAM macro utilizing the High Speed DRAM Local Bit Line Sense Amplifier is shown schematically in FIG. 2. Each of the Local Bit Line Sense Amps, shown as a box in FIG. 2 inscribed with the letters S/A, is connected to two local bit lines and one global bit line (as shown in FIG. 1) and is accessed by M word lines (where M is given as 128 but could be 64 or 256, for example). In FIG. 2, a DRAM memory cell is implied at each of every two points where a word line crosses a local bit line. Each Local Bit Line Sense Amplifier is then replicated N times on each global bit line, where N=8 for the example of FIG. 2. Global bit lines are paired as even and odd, and each pair attaches to and provides input to a Global Sense Amplifier Latch, as shown in FIG. 2.

The connection of each Global S/A Latch with its corresponding Local Bit Line Sense Amps and local bit lines is then replicated P times in the vertical direction, where P is given as 512 in FIG. 2, with the word lines extending vertically across the entire array of 2P global bit lines and 4P local bit lines. Each word line is connected to and driven by word address decode circuitry indicated at the bottom of the Figure. The arrangement of FIG. 2 provides an embedded DRAM macro of 2MNP bits, or approximately one million bits for this particular example. Each global sense amplifier latch can be routed to a separate output line, for a configuration of very high bandwidth, or can be decoded with bit addressees for fewer bits out. In any case, each global sense amp latch will be decoded for even or odd selection of the two global bit lines being accessed by each global S/A latch.

Returning again to FIG. 1, the operation of the invention will be described. During standby all word lines are at ground potential (0 volts), providing for all DRAM cell capacitors to be isolated from their corresponding local bit lines. The restore clock RL is low (0 volts), and therefore Node 1 is charged to VDD (assume 2.5 volts for the example) via P-channel transistor T5. Node 2 is clamped at ground potential through T4, since RLbar (the complement of RL) is high. T3 and T6 are therefore OFF during Standby operation. Also, RL0 and RL1 are both low, turning on p-channel transistors T10 and T11, and decoded address signals WA0 and WA1 are also both high, thus turning on n-channel transistors T8 and T9. Transistor T12 is OFF, and therefore idle current J4 is split evenly among all local bit line sense amps in the macro. Consequently, T1 is conducting a small idle current which is equal to J4 divided by the total number of Local Bit Line Sense Amps in the entire DRAM macro. The idle current is chosen so that transistor T1 is biased in its subthreshold region during the standby mode. (In subthreshold the drain current of T1 is related exponentially to the transistor gate-to-source voltage.)

Figure 3:
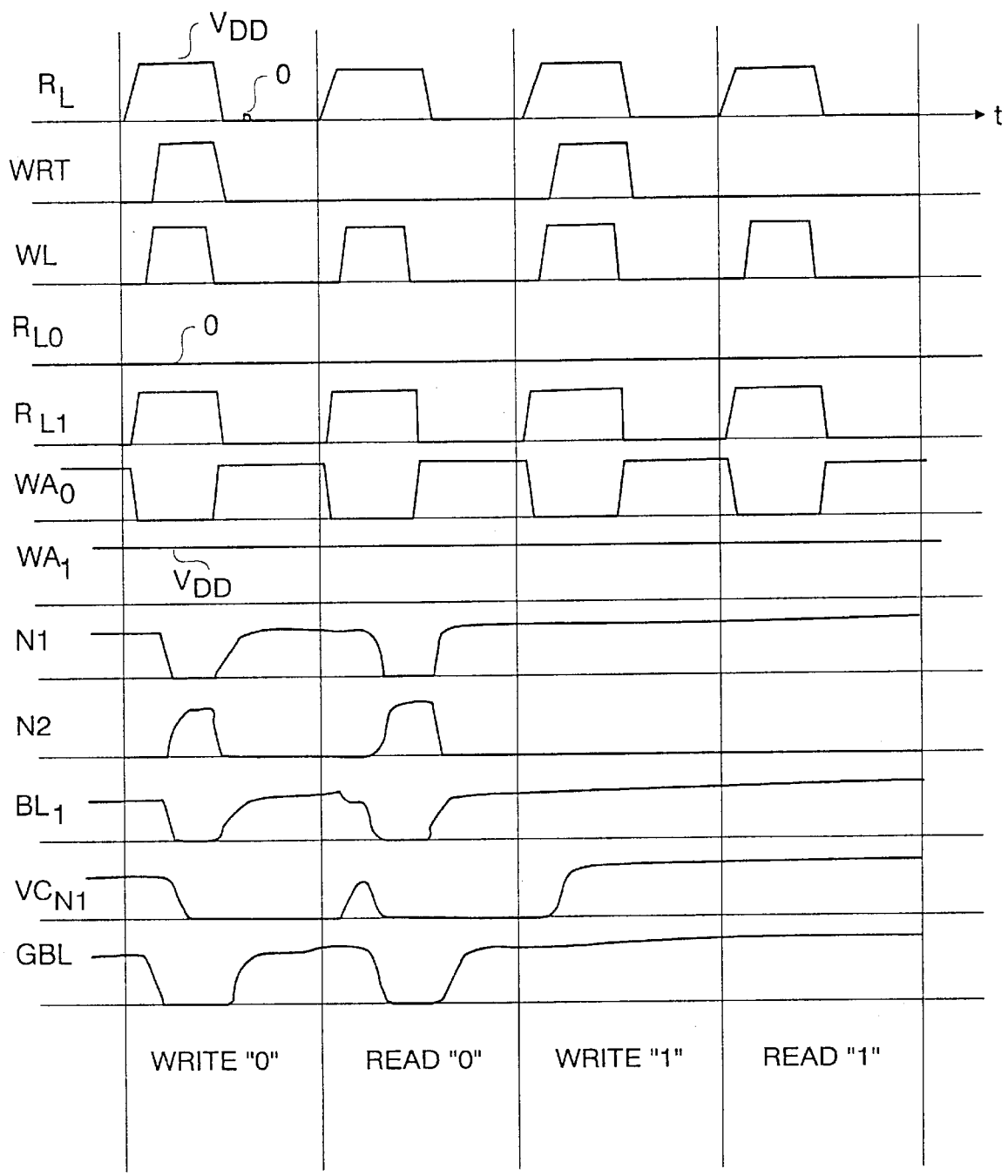
FIG. 3 shows typical waveforms for read and write operations to the circuit of FIG. 1.

Node 3 therefore idles at a voltage equal to VREF (the gate voltage of T1) minus a threshold voltage VT drop and a small additional voltage drop dV to sustain the idling drain current in T1. For this description assume the idling/standby voltage on node 3 is about 1.5 volts. VREF is intentionally chosen to be less than VDD by some amount, and is regulated on board the chip, so as to set the standby voltage on node 3 of all Local Bit Line Sense Amps to the same voltage VREF−VT−dV. Transistors T8, T9, T10, and T11 are all chosen sufficiently large compared to T1 and are turned on with WA0 and WA1 at a full VDD, so as not to appreciably affect the standby voltage on Node 3 and the two local bit lines BL0 and BL1. Node 4 and each local bit line will also be at nearly the same voltage as node 3 during standby. The idling line Node 4 is heavily de-coupled to a fixed, constant voltage across the entire macro via the large decoupling capacitor C4. Continuing with FIG. 1, read and write operations will next be described. Typical waveforms of input signals, internal nodes, and the sense amp output are shown in FIG. 3. Shown in the figure are waveforms for WRITE "0", READ "0", WRITE "1", and READ "1" cycles. The circuit operation will be described assuming only WL1 is selected and only Cell 1 on BL1 will be accessed for read and write-operations. Corresponding waveforms can be constructed for reading and writing to the other cells on FIG. 1.

At the beginning of the WRITE "0" cycle (and all cycles) the restore clock RL returns to its up level (VDD), turning OFF transistors T4 and T5. At the same time word decode circuitry is set in operation to select one word line in the macro and drive it to its up level VCC. The write clock WRT is also driven high, while at the same time, the global bit line GBL is pulled to ground to place a "0" on the line. Additional decoded signals are applied to transistors T8–T11 in order to select one of the two neighboring local bit lines for access and to clamp the other line at the fixed potential on Node 4. For this case T8 and T11 are turned OFF via signals WA0 (low) and RL1 (high), whereas T9 and T10 are both kept ON via their gate voltages WA1 (high) and RL0 (low). Referring to FIG. 2, it is clear that during any read or write cycle, alternating local bit lines are accessed while their nearest neighbor local bit lines are clamped to Node 4. This aspect of the invention is important for minimizing capacitive noise coupling between selected local bit lines during either read or write cycles.

Continuing with the WRITE "0" cycle in cell 1, the zero voltage state written on node 3 via T7, in turn, writes this "0" on local bit line BL1 and into cell 1 via cell transistor TN1. At the same time, sense amp node 1 is pulled to ground, since T1 turns on when node 3 falls to zero turning on T2 which pulls node 2 to VDD. T3 and T6 therefore also turn on and clamp the local bit line and the sense amp at the "0" state until the write operation is ended and the restore clock again recharges Node 1 and discharges Node 2.

Continuing with FIGS. 1 and 3, a READ "0" operation will be described next. At the start of the cycle all nodes are set at their restore (precharged) condition. When restore clock RL goes high and RLbar goes low again isolating nodes 1 and 2, the selected word line WL1 is again driven high. As in the WRITE "0" cycle T8–T11 are again set up with decoded signals WA0, WA1, RL0, and RL1 so that T9 and T10 remain ON while T8 and T11 turn OFF. When WL1 comes high and turns ON cell transistor TN1, a small negative differential voltage is applied to local bit line BL1 by the charge in cell capacitor CN1, as is standard for a DRAM operation. This small negative differential on bit line BL1 is typically of the order of 300 mV (see FIG. 3) due to the unsymetrical capacitance ratio between CN1 and CBL1 of about 1 to 4 typically, assuming the pair standby voltage on BL1 is about 1.5 V.

The small 300 mV signal on BL1 and therefore Node 3 via T9 quickly starts the discharge of the very small sense amp capacitance C1 since transistor T1 has been biased in its exponential subthreshold region in standby. In this subthreshold region the drain current of T1 is extremely sensitive to a negative going voltage change on its source, i.e. Node 3. Therefore, T1's drain current can quickly increase by several orders of magnitude with only several hundred millivolts change in voltage on Node 3. The subthreshold region drain current sensitivity is typically quoted as a factor of 10 increase in current for only 80–100 mV increase in gate-to-source voltage, depending somewhat on temperature. Since C1 is a small capacitor, Node 1 very quickly starts discharging towards the voltage of Node 3. At this time, p-channel transistor T2 begins turning ON, as the voltage on Node 1 drops below VDD by more than the threshold voltage of T2. T2 therefore quickly starts charging up Node 2 which, in turn, starts turning ON T3 and T6.

The action of the local bit line sense amp is self-regenerative, in that the action of T3 turning ON discharges further Node 3 which, in turn, further turns on T1, etc. The regenerative operation ends only when Nodes 1 and 3 are discharged entirely to ground, Node 2 is charged completely to VDD, and the sense amp is therefore latched in the "0" state. The operation of latching a "0" in the sense amp also writes a clean solid "0" back in the cell being selected, Cell 1 via T9 and TN1. The action of turning on T6 discharges the global bit line which, in turn, is sensed as a "0". The cycle ends when the restore clock again goes low, breaking the self-regenerative action of the local bit line sense amp and again restoring all nodes to their precharged states.

The very high speed of the local bit line sense amp in sensing a "0" and writing it back into the cell is due to several factors. One such factor is the design of the ratio of capacitors C1, CBL1, and CN1 (where C3 is implied as part of CBL1). This ratio is typically chosen as 1 to 10 to 3, for example. That is, if CN1 is about 25 fF, then a good design would choose CBL1 (+C3) at about 100 fF, and C1 at about 10 fF. Other similar ratios will also suffice. A second factor in the high speed of the local bit line sense amp in sensing a "0" is the idling bias state of transistor T1 in the sub-threshold region, as previously described, so as to provide very high sensitivity of drain current to small changes in gate-to-source voltage.

WRITE "1" and READ "1" operations are quite simple as is seen on FIG. 3. Since the restore operation at the trailing portion of each cycle restores the global bit line and the local bit lines to their corresponding high states (typically VREF−VT), the WRITE "1" operation simply places this high voltage into the selected cell, while not affecting the states of all unselected cells. Transistors T8–T11 again function as in the previously described read and write cycles. In the READ "1" cycle the voltages on all nodes in the local bit line sense amp essentially stay fixed at their precharged state(s), as the high cell voltage does not discharge the local bit line BL1 which is also high at the same voltage. Therefore, transistor T1 does not conduct and the high voltage on Node 1 remains at VDD, thus retaining the zero volt state on Node 2.

In this case, there is no self-regenerative functioning of the sense amp and T6 remains OFF, keeping the global bit line high at the "1" state. This "1" is then sensed and latched in the particular global sense amplifier assigned to line GBL under consideration. In practice, due to the possibility of leakage from the high "1" state in the cell, there may, in fact, be a small voltage movement of the local bit line BL1 when reading a (weak) "1". This action of the weak "1" will, in turn, cause a small drop in the voltage on Node 1. The circuit is designed with adequate margin so as to allow a weak "1" drop of about 0.3 volt, typically, while still retaining the ability to correctly sense both a "0" and a "1".

Referring to FIG. 2, it is noted that only one word line is selected and driven high at any given time. Therefore, only one of N (N=8 for this example) local bit line sense amps on any global bit line is activated at a given time. Consequently, the other N−1 local bit line sense amps remain quiescent or in the standby mode. Therefore, most (i.e. [N−1]/N) of idle current source J4 continues to flow through device T1 on all unactivated local bit line sense amps, thus maintaining a precise, constant voltage on Node 4 and across de-coupling capacitor C4.

Transistor T12 is designed with the proper width/length ratio so as to compensate for that exact amount of idle current (1/N)×J4 which is switched away from the selected word group during the active, read/write portion of the cycle. When the restore clock drops signifying the end of the read/write portion of the cycle and the beginning of the restore operation, T12 turns off again allowing the entire J4 current to flow evenly divided through all the T1 transistors in all N×2P local bit line sense amps. This arrangement provides a constant, highly de-coupled voltage on Node 4 at all times, and reduces any coupled noise to the unselected local bit lines and sense amps.

Figure 4:
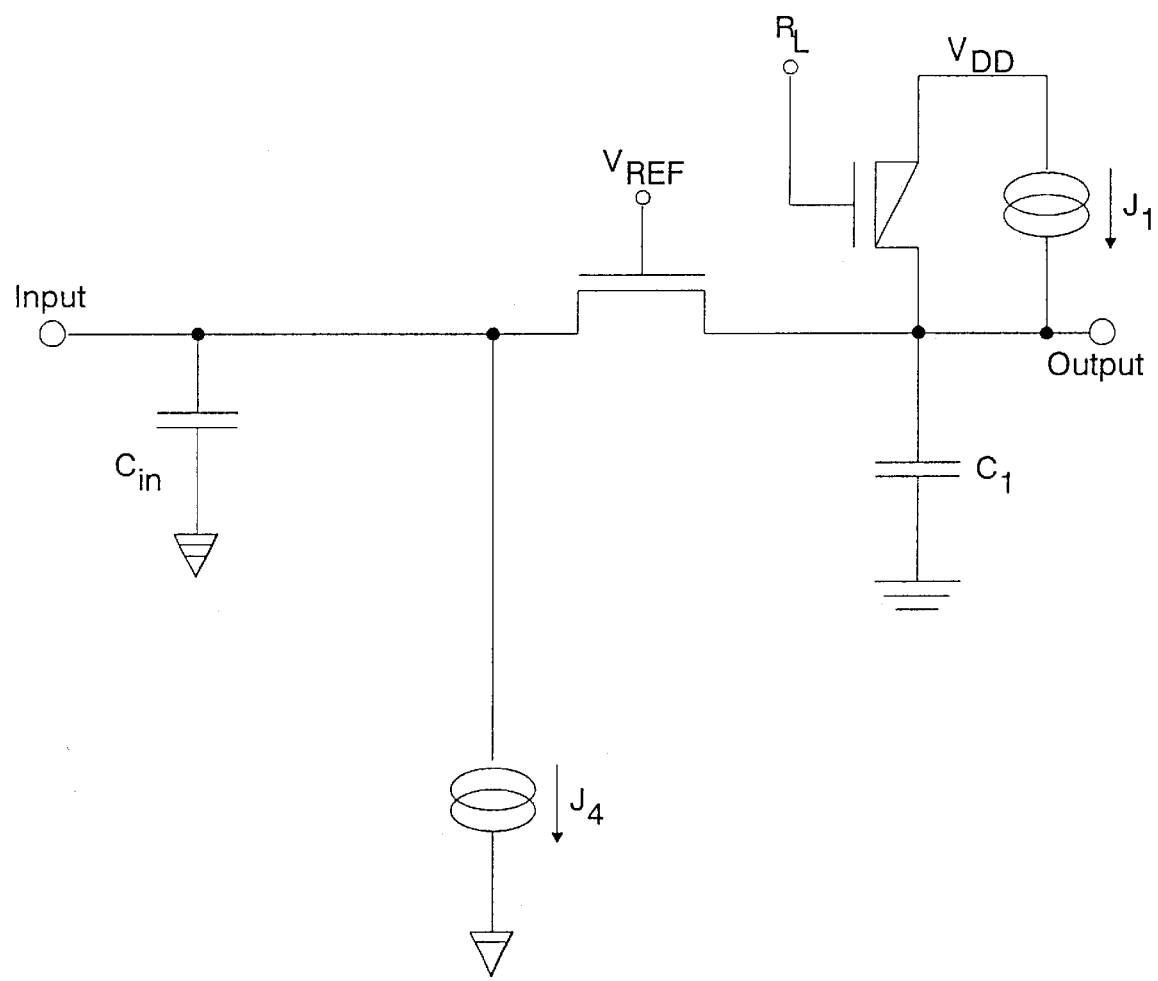
FIG. 4 shows another preferred embodiment of the invention.

FIG. 4 shows another preferred embodiment of the invention. It shows an n type field-effect transistor T1 with its gate connected to a constant voltage source $V_{ref}$. The source of T1 is connected to a substantially constant current source $J_4$ and to an input node for receiving an input current which is to be detected or measured. This input node also has a capacitance to ground or any other fixed potential connected to it, which includes the input capacitance of the transistor T1. The direction of current flow in $J_4$ is away from the input node, as shown.

The drain of T1 is connected to an output node which has a capacitance to ground $C_1$, which includes the output capacitance of transistor T1. The output node is also connected to the drain of a p-type field-effect transistor T2. The source of T2 is connected to a positive power supply voltage $V_{dd}$ and its gate is connected to an input signal $R_L$. The output node is also connected to a current source $J_1$ flowing into the output node as shown.

Prior to receiving a current on the input node, the circuit of FIG. 4 is conditioned by having T2 turned on to connect the drain of T1 to $V_{dd}$. In steady state, a current $J_4$ will flow from $V_{dd}$ through T1 and out the current source $J_4$ towards ground. The voltage on the input node will adjust to a level just sufficient that T2 is turned on enough to conduct the current $J_4$. The dimensions of T1, the threshold voltage of T1, and the magnitude of $J_4$, are chosen so that T1 is conducting in its subthreshold region.

To detect an input current or charge, T2 is turned off prior to receiving that current. Then only the current $J_1$ flows from the $V_{dd}$ supply to the output node. If $J_1=J_4$ and there is no input current, the current through T1 will be $J_4$ and there will be zero net current in the output node, which will then remain at a voltage $V_{dd}$. If a signal current $J_S$ is drawn from the input node, then the current drawn through T1 will become $J_S+J_4$. The voltage at the input node will drop by a small amount $\Delta v_S$ to increase the gate-source voltage on T1 and cause the increased current to flow. The current at the output node will then become unbalanced by the amount $J_S$ and the voltage there will fall as the capacitance $C_1$ is discharged by $J_1$. The fall of the output voltage can be substantially larger than the input voltage change $\Delta v_S$ if $C_1<C_{in}$. Thus, charge can be transferred from the input node to the output node and detected as a large voltage swing.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A sense amplifier for detecting a change of charge out of an input node, the sense amplifier comprising:

a first current source for removing charge from said input node;

a first field effect transistor having
   i) a source coupled to said input node,
   ii) a gate electrode coupled to a first voltage Vref, and
   iii) a drain coupled to a first side of a first capacitor, to an output node, and to a precharge circuit for setting the voltage of said output node to a second voltage; and
an idle circuit connected to the source of the transistor to conduct an idle current to said source to bias the transistor, during a standby mode, in a subthreshold region; and
wherein said first transistor has a voltage difference from its drain to its source, and a second side of said capacitor is coupled to ground.

2. The sense amplifier of claim 1 wherein said precharge circuit includes a control signal coupled to a gate of a second field effect transistor for turning off said precharge circuit prior to sensing.

3. The sense amplifier of claim 1 further including a second current source coupled to said output node for supplying charge to said output node.

4. The sense amplifier of claim 3 wherein said charge removed by said first current source is substantially equal to said charge added by said second current source.

5. The sense amplifier of claim 1 wherein said first current source is set to bias said first field effect transistor to conduct at a current corresponding to the current at weak inversion (near the threshold voltage) of said first field effect transistor.

6. The sense amplifier of claim 1 further including a latch for holding the voltage at the output node and for discharging the input node at times a "0" is detected (drawing current out of the input node to turn on said first transistor to a more conductive state).

7. The sense amplifier of claim 1 wherein said input node is coupled through a first switch to a second node, said second node having greater capacitance than said input node for restoring the input node to said voltage of said input node prior to sensing.

8. The sense amplifier of claim 1 wherein said input node is coupled through a first switch to a second node, said second node having a voltage source for restoring the input node to said voltage of said input node.

9. The sense amplifier of claim 1 further including a first switch for removing said first current source prior to sensing.

10. The sense amplifier of claim 1 wherein said input node is coupled to a first bit line coupled to a plurality of memory cells in an array of memory cells, said first bit line positioned between neighboring second and third bit lines each coupled to a respective plurality of memory cells in said array, and a circuit for clamping the voltage of said second and third bit lines at times a memory cell coupled to said first bit line is read or written.

11. A method of operating a sense amplifier for detecting a change of charge out of an input node, wherein the sense amplifier comprises a first field effect transistor having (i) a source coupled to the input node, (ii) a gate electrode coupled to a first voltage Vref, and (iii) a drain coupled to a first side of a first capacitor, to an output node and to a precharge circuit, the method comprising:
   providing a first current source for removing charge from said input node;
   using the precharge circuit to set the voltage of the output node to a second voltage;
   providing an idle circuit to generate an idle current; and
   applying the idle current to the source of the transistor to bias the transistor, during a standby mode, in a subthreshold region, and
   wherein said first transistor has a voltage difference from its drain to its source, and a second side of said capacitor is coupled to ground.

12. A method according to claim 11, wherein the precharge circuit includes a control signal coupled to a gate of a second field effect transistor for turning off said precharge circuit prior to sensing.

13. A method according to claim 11, further comprising the step of providing a second current source coupled to the output node for supplying charge to said output node.

14. A method according to claim 13, wherein said charge removed by said first current source is substantially equal to said charge added by said second current source.

15. A method according to claim 11, wherein the first current source is set to bias the first field effect transistor to conduct at a current corresponding to the current at weak inversion, near the threshold voltage, of said first field effect transistor.

* * * * *